United States Patent [19]

Toyonaga et al.

[11] Patent Number: 5,673,200
[45] Date of Patent: Sep. 30, 1997

[54] LOGIC SYNTHESIS METHOD AND LOGIC SYNTHESIS APPARATUS

[75] Inventors: Masahiko Toyonaga, Hyogo; Michiaki Muraoka, Nara, both of Japan

[73] Assignee: Matsushita Electric Industrial Co., Ltd., Osaka, Japan

[21] Appl. No.: 667,284

[22] Filed: Jun. 20, 1996

Related U.S. Application Data

[63] Continuation of Ser. No. 389,038, Feb. 15, 1995, abandoned.

[30] Foreign Application Priority Data

Feb. 16, 1994 [JP] Japan .................. 6-019390

[51] Int. Cl.⁶ ................................................. G06F 15/60
[52] U.S. Cl. ................................. 364/490; 364/488; 364/489
[58] Field of Search ....................... 364/488–491, 364/578; 395/500

[56] References Cited

U.S. PATENT DOCUMENTS

| | | | |
|---|---|---|---|
| 4,591,993 | 5/1986 | Griffin et al. | 364/491 |
| 4,612,618 | 9/1986 | Pryor et al. | 364/490 |
| 4,694,403 | 9/1987 | Nomura | 364/488 |
| 4,698,760 | 10/1987 | Lembach et al. | 364/490 |
| 4,703,435 | 10/1987 | Darringer et al. | 364/489 |
| 4,916,627 | 4/1990 | Hathaway | 364/490 |
| 5,003,487 | 3/1991 | Drumm et al. | 364/489 |
| 5,222,030 | 6/1993 | Dangelo et al. | 364/489 |
| 5,237,513 | 8/1993 | Kaplan | 364/490 |
| 5,287,289 | 2/1994 | Kageyama et al. | 364/489 |
| 5,299,137 | 3/1994 | Kingsley | 364/489 |
| 5,345,393 | 9/1994 | Ueda | 364/489 |
| 5,392,221 | 2/1995 | Donath et al. | 364/489 |

OTHER PUBLICATIONS

Wolff et al., "Power/Timing: Optimization and Layout Techniques for LSI Chips," 1978, Design Automation & Fault Tolerant Computing, pp. 145–164.

Primary Examiner—Kevin J. Teska
Assistant Examiner—A. S. Roberts
Attorney, Agent, or Firm—McDermott, Will & Emery

[57] ABSTRACT

In synthesizing a gate level logic circuit using a computer based on behavioral description of LSI, a logic circuit is first synthesized based on the behavioral description and, then, its power consumption is obtained from the total number of operations. Thereafter, a specific signal propagation path having a larger power consumption is found out from a plurality of signal propagation paths in the logic circuit. A partial logic circuit consisting of logic elements positioned on the specific signal propagation path is optimized in the number of level, thereby creating an optimized partial circuit. Thereafter, obtained is a power consumption of a logic circuit consisting of the optimized partial circuit and the remaining circuit other than the circuit portion optimized. When thus obtained power consumption is small, the partial circuit being not optimized is replaced by the above optimized partial circuit. Accordingly, it becomes possible to reduce overall power consumption while adequately maintaining an area and speed performance of the logic circuit.

10 Claims, 9 Drawing Sheets

LOGIC SYNTHESIS METHOD AND LOGIC SYNTHESIS APPARATUS

This is a continuation application of application Ser. No. 08/389,038 filed Feb. 15, 1995, now abandoned.

BACKGROUND OF THE INVENTION

The present invention relates to a logic synthesis method (CAD method) and a logic synthesis apparatus (CAD apparatus) used in designing a gate level logic circuit of a semiconductor apparatus and a printed circuit board within a short period of time, and more particularly to improvement of a logic synthesis method and a logic synthesis apparatus useful in the reduction of electric power consumption.

Recent advancement in size reduction and personal use is remarkable in the field of electronic devices incorporating integrated circuits or printed circuit boards. Fixed power units and large-scale batteries are thus becoming unpopular and unsuitable for such devices. It is therefore essential in the design stage of circuits how electric power consumption is effectively reduced or suppressed. To achieve the reduction of electric power consumption in the system incorporating such LSI chips or printed circuits, there has been conventionally proposed the following three methods which are, for example, disclosed in Vivek Tiwari et al. "Technology Mapping for Low Power" 30th Design Automation Conference, pp 74–49 (1993))

(1) A method of minimizing the total number of operational changes in an element by considering operation of the system and adequately deciding scheduling, such as types and total number of elements to be used and selection between parallel processing and serial processing for a plurality of operations including additions and multiplications.

(2) A method of introducing a circuit for cutting current to be supplied to a particular functional block on a chip when the corresponding function is not used.

(3) A logic synthesis method including steps of obtaining an electric power consumption value of each element as an imaginary element area, adding this imaginary element area to an actual element area, and minimizing the resultant total element area using the area optimization processing of the logic synthesis.

However, the above method (1) is functionally regarded as a method for minimizing an area of the logic circuit. Hence, the degree of effect expected in improving electric power consumption cannot exceed that of a logic circuit whose area is minimized using a conventional method.

Furthermore, the above method (2) is limited to a relatively rare case and not applicable to a ceaselessly operating circuit. More specifically, this method is applicable when the programs and operational conditions in MPU or the like assure that the system is not disturbed by an interruption of operation. Under such limited circumstances, electric power or clock signals are prohibited to be supplied to a particular circuit executing a designated function only when the corresponding function is not in operation, thereby reducing electric power consumption. In other words, this method is only effective when it is used for the circuit having a significant dormant period or state during the operation of the system.

Still further, the above method (3) regards electric power consumption as the imaginary area, adds this imaginary area to the actual area, and minimizes the resultant total area using the conventional area optimization processing of the logic synthesis. According to this method, it is afraid that the actual area may be enlarged even if the total area is reduced. Namely, in some occasions, reduction of the imaginary area (i.e. electric power consumption) may exceed the increase of the actual area. Therefore, although reduction of electric power consumption is feasible, the area of a logic circuit may be enlarged and hence speed performance may be deteriorated. In short, optimization of the area and speed is not always assured.

As described in the foregoing description, any of the above conventional methods was not a satisfactory logic synthesis method in view of the effect of reduction of electric power consumption in a logic circuit, especially in a logic system whose operation is very frequent, when its area and speed are maintained at optimum values.

SUMMARY OF THE INVENTION

Accordingly, in view of above-described problems encountered in the prior art, a principal object of the present invention is to provide a logic synthesis method and a logic synthesis apparatus capable of effectively reducing electric power consumption in a logic circuit, especially in a logic circuit whose operation is very frequent, while maintaining high speed of operations and suppressing increase of the area of the logic circuit.

In order to accomplish this and other related objects, the present invention pays its attention to the following points. More specifically, a chief cause of electric power consumption is change of signal value in each logic element, and the change of signal value in the logic element is successively propagated along the signal propagation path in the logic circuit. Therefore, finding out a specific signal propagation path whose electric power consumption is larger than others can contribute the effective reduction of overall electric power consumption in this signal propagation path system. Such a large power consuming signal propagation path is solely a part of all the signal propagation path system in the logic circuit. Thus, even if the area of the large power consuming signal propagation path is enlarged as a result of reduction of electric power consumption, such an increase of the area will be small or negligible if it is compared with the total area of the logic circuit. Moreover, if the level number of logic is reduced in order to reduce electric power consumption in a signal propagation path, it will be advantageous in the speed up of signal propagation speed.

Thus, the present invention provides a logic synthesis method for synthesizing a gate level logic circuit using a computer based on behavioral description of LSI, comprising steps of: an input processing for inputting the behavioral description of the LSI and element information including at least an element area, a delay time of signal propagation and a power consumption; a logic synthesis processing for synthesizing a logic circuit taking area specification and speed specification into consideration based on the behavioral description and element information entered in the input processing; a high power consumption path retrieval processing for obtaining a sum of power consumption in logic elements existing on each signal propagation path of a plurality of signal propagation paths in the logic circuit synthesized by the logic synthesis processing, and finding out a specific signal propagation path having a larger power consumption; a level number reduction processing for reducing a number of level of a partial logic circuit constituting a part of the specific signal propagation path having a large power consumption which is found out by the high power consumption path retrieval processing, and producing another partial logic circuit a number of level of which is smaller than that of the partial logic circuit; and a circuit replacement processing for replacing the partial logic circuit constituting a part of the specific signal propagation path having a large power consumption by the another partial logic circuit created by the level number reduction processing.

Furthermore, the present invention provides a logic synthesis apparatus comprising means for executing the above-described processing of the logic synthesis method.

Furthermore, the present invention includes a circuit analysis processing for obtaining a power consumption of each element constituting the logic circuit synthesized by the logic synthesis processing and a total power consumption of the logic circuit prior to the high power consumption path retrieval processing.

In addition, according to the present invention, the input processing of the logic synthesis method inputs circuit operation verificational information indicating expectation to test vectors for the logic circuit. And, the circuit analysis processing comprises: a first processing for executing logic simulation based on the logic circuit and the circuit operation verificational information; a second processing for memorizing an output operation number M(i) of an arbitrary i-th (i=1-N) element obtained from the logic simulation in the first processing; a third processing for obtaining a power consumption W(i) of the arbitrary i-th element based on an equation W(i)=M(i)·w(i), where M(i) represents the output operation number of the arbitrary i-th element obtained in the second processing while w(i) represents a power consumption per operation calculated from the element information; and a fourth processing for obtaining a total power consumption D based on an equation $$D = \sum_{i=1}^{i=N} W(i)$$

which is a sum of power consumption obtained in the third processing with respect to all the elements N in the logic circuit.

Moreover, according to the present invention, the high power consumption path retrieval processing of the logic synthesis method comprises: a fifth processing for creating a directed graph G(i) representing input and output terminals of an arbitrary i-th (i=1-N) signal propagation path in the logic circuit; a sixth processing for allocating a cost to an output branch of each node of the directed graph G(i) obtained in the fifth processing, the cost being the power consumption W(i) of a logic element acting as each node, which is obtained in the third processing of the circuit analysis processing; and a seventh processing for finding out a propagation path having a high power consumption from the directed graph G(i) which is cost given in the sixth processing.

With above arrangement, in a logic circuit having performance and area adequately adjusted by the logic synthesis method with their trade off, a partial logic circuit constituting a signal propagation path having a large value in the sum of power consumption is replaced by another partial logic circuit having a smaller number of level. With this level reduction processing, not only processing speed is increased in the partial logic circuit but power consumption is reduced.

In the partial logic circuit constituting a part of the signal propagation path having a high power consumption, changes of signal values which are cause of power consumption are successively propagated. Thus, reduction of power consumption in this high power consumption path enables us to effectively reduce the overall power consumption in the logic circuit.

In this case, even if the replaced partial logic circuit has an area increased more or less compared with that of the original partial logic circuit, increase of area of overall circuit can be suppressed as less as possible because the partial logic circuit is only a part of the logic circuit. Thus, the total area of the logic circuit can be maintained at substantially the same value before and after the replacement of partial logic circuit.

Furthermore, reduction of the number of level is applied to a limited range i.e.—a partial logic circuit constituting a part of the high power consumption path; thus, the processing time required for reduction of power consumption can be decreased. Yet further, effect of power consumption can be accurately verified.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENT

Hereinafter, a preferred embodiment of the present invention will be explained in greater detail with reference to the accompanying drawings.

Figure 1A:
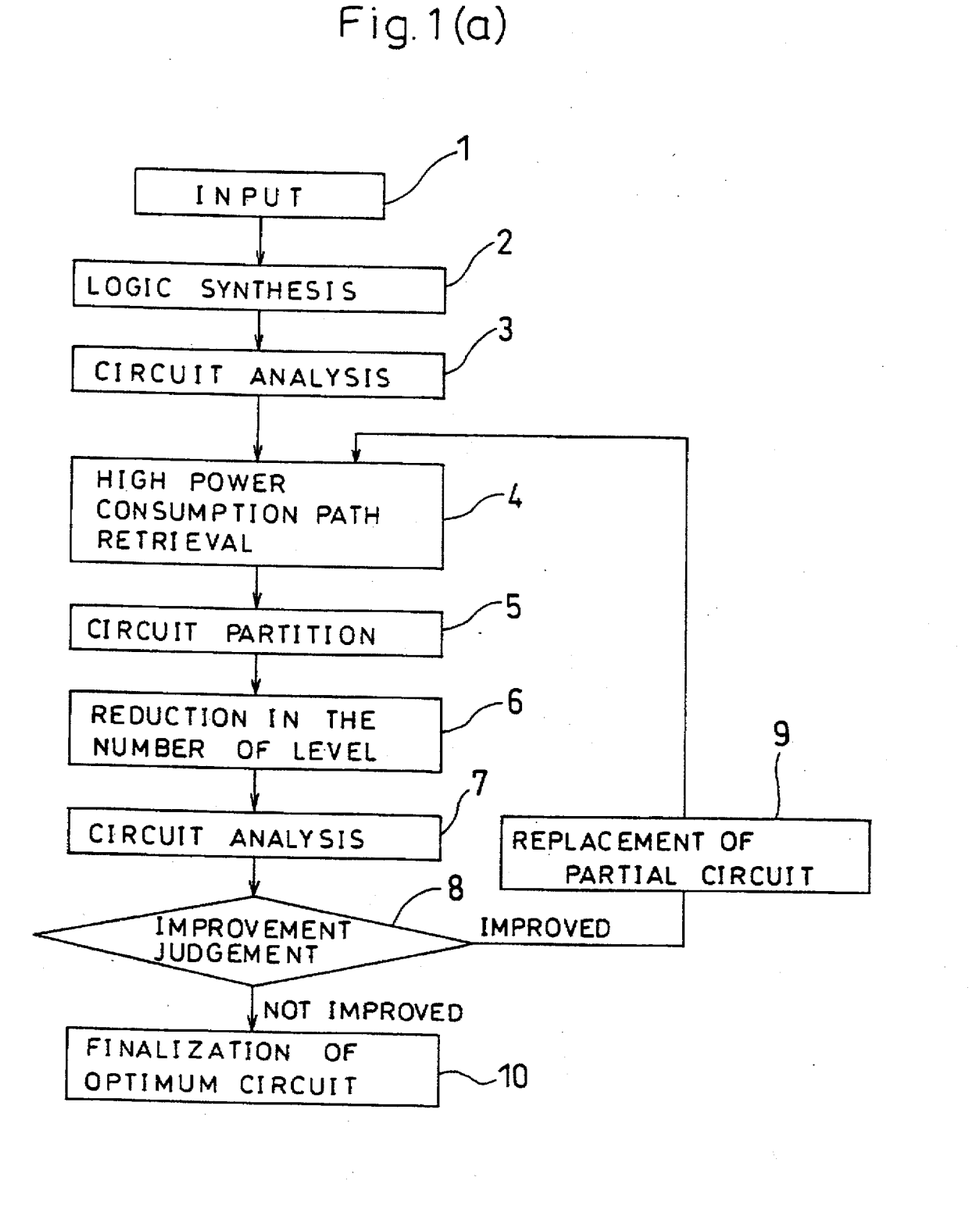
FIG. 1A is a flowchart showing a main routine of the logic circuit synthesis method in accordance with the present invention.
Figure 1B:
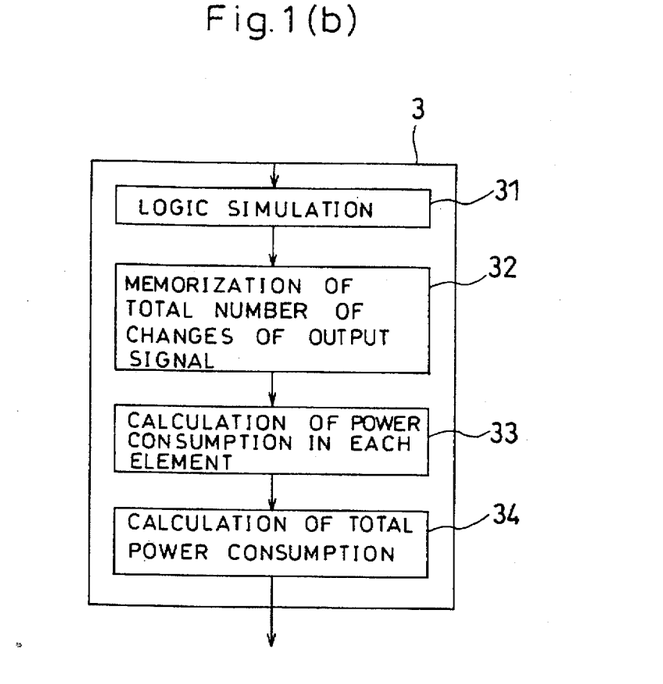
FIG. 1B is a flowchart showing details of a circuit analysis processing.
Figure 1C:
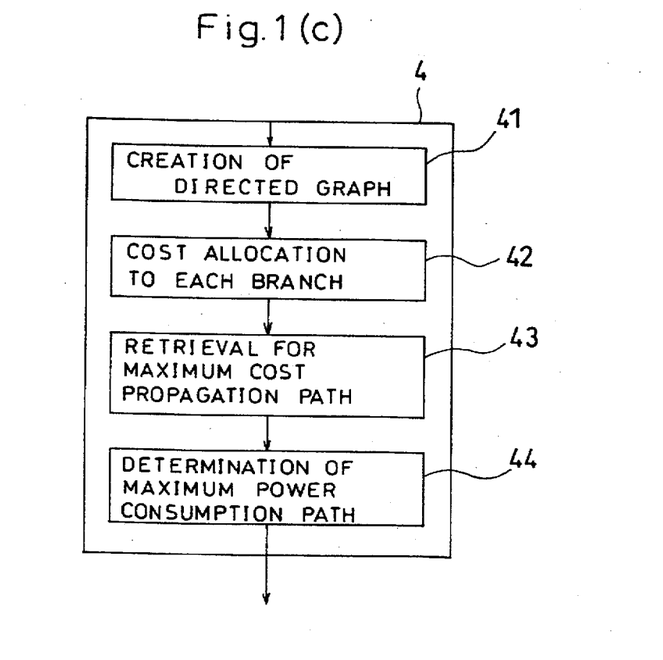
FIG. 1C is a flowchart showing details of a retrieval processing for finding out a high power consumption path.
Figure 2:
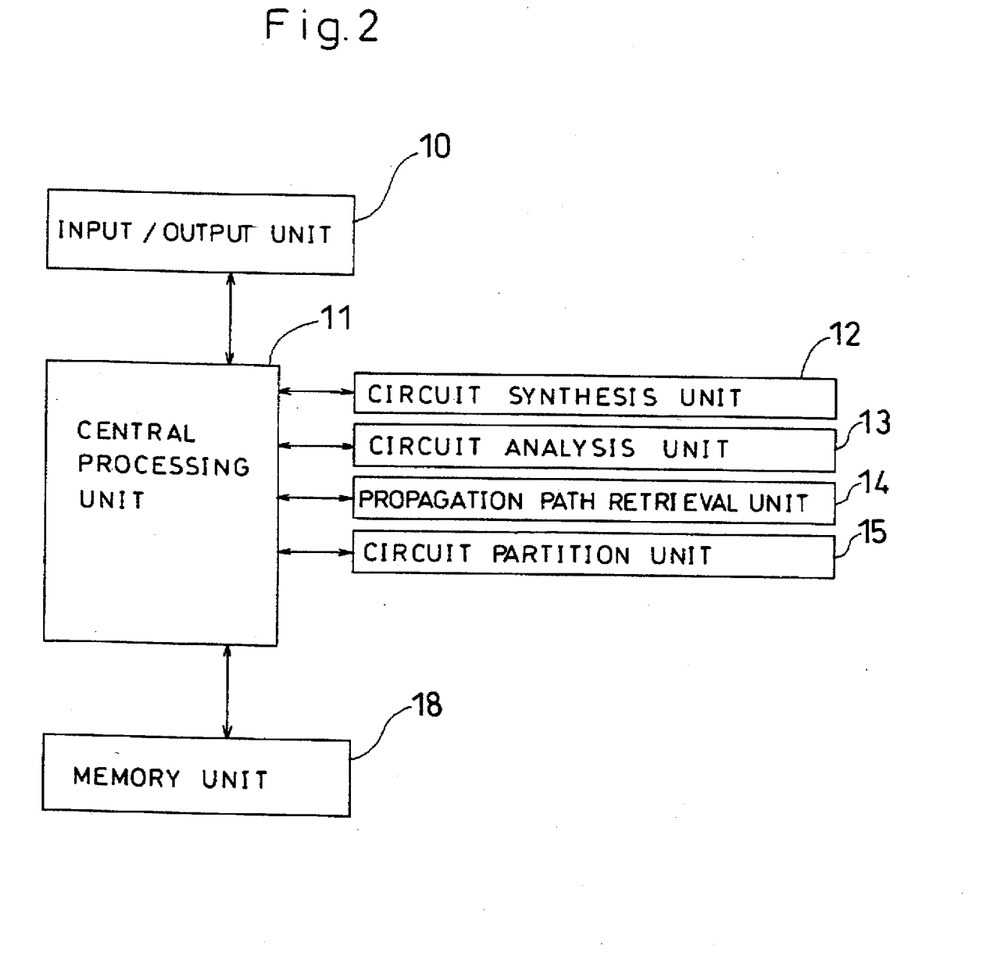
FIG. 2 is a block diagram showing a schematic arrangement of a logic circuit synthesis apparatus in accordance with the present invention.

FIGS. 1A, 1B and 1C are flowcharts showing processing routines of the logic synthesis method in accordance with the present invention. FIG. 2 is a block diagram showing a schematic arrangement of the logic synthesis apparatus in accordance with the present invention.

First of all, various data used in this embodiment will be explained. An example of behavioral description is shown in the following equation, where a–k represent values of input signals and Y represents a value of an output signal. It is assumed that operational symbols and each signal value are expressed in compliance with Boolean algebra.

$$Y=(a+b)\cdot(c+d+e)\cdot(f+g+h+i)+(j\cdot k) \quad \text{[Equation 1]}$$

A general logic circuit will have memory elements other than the above equation, although they are not disclosed in this embodiment.

Table 1 shows circuit operation verificational information which are so-called test vectors representing time series values of respective signals in the circuit. In expressing such circuit operation verificational information, each signal is designated by numerals 1 and 0 only, although the signals are generally designated by a combination selected from the group of 1, 0 and "undefined". An output signal value corresponding to a circuit input signal value is referred to as expectation or expected value. The expectation is identical with an output value of the logic circuit when the logic circuit is synthesized normally and operates in good order. A unit of time is 0.1 second.

| TIME | SIGNAL | a b c d e f g h i j k | EXPECTATION Y |
|---|---|---|---|
| 0 | | 0 0 0 0 1 0 1 1 0 1 0 | 0 |
| 1 | | 1 0 1 0 1 0 0 0 1 1 0 | 1 |
| 2 | | 0 0 1 0 1 0 0 0 1 1 0 | 0 |
| 3 | | 1 0 1 0 1 0 0 0 1 1 0 | 1 |
| 4 | | 0 0 1 1 1 0 0 0 1 1 0 | 0 |
| 5 | | 1 0 0 1 1 1 0 0 1 1 1 | 1 |
| 6 | | 0 0 0 0 1 1 0 1 1 1 1 | 1 |
| 7 | | 1 0 0 0 1 1 0 1 0 0 1 | 1 |
| 8 | | 0 0 0 1 1 1 1 1 0 0 1 | 0 |
| 9 | | 1 0 0 1 1 0 1 1 0 0 1 | 1 |
| 10 | | 0 0 0 0 1 0 1 1 0 0 1 | 0 |

Element information includes an area, a delay time and a power consumption value. For simplification, it is assumed that the element area is 100 μm² and an output delay time is 1 ps. Moreover, a power consumption value is 1 mW in each transition of the output signal from 0 to 1 or 1 to 0.

In FIG. 2, a reference numeral 10 represents an input/output unit; a reference numeral 11 represents a central processing unit; a reference numeral 12 represents a circuit synthesis unit; a reference numeral 13 represents a circuit analysis unit; a reference numeral 14 represents a propagation path retrieval unit; a reference numeral 15 represents a circuit partition unit; and a reference numeral 18 represents a memory unit.

Returning to FIG. 1, an input processing 1 is executed by an input means consisting of the input/output unit 10, the central processing unit 11 and the memory unit 18 shown in FIG. 2. This input processing 1 takes in various element information such as previously described behavioral description, circuit operation verificational information, power consumption, and area.

Next, in a logic synthesis processing 2, the following gate level logic circuit C1 is created taking account of area and speed by a synthesis means consisting of the central processing unit 11 and the logic synthesis unit 12. In this case, the logic circuit C1 can be finally obtained by first considering the area and thereafter considering the speed or vice versa.

Figure 3:
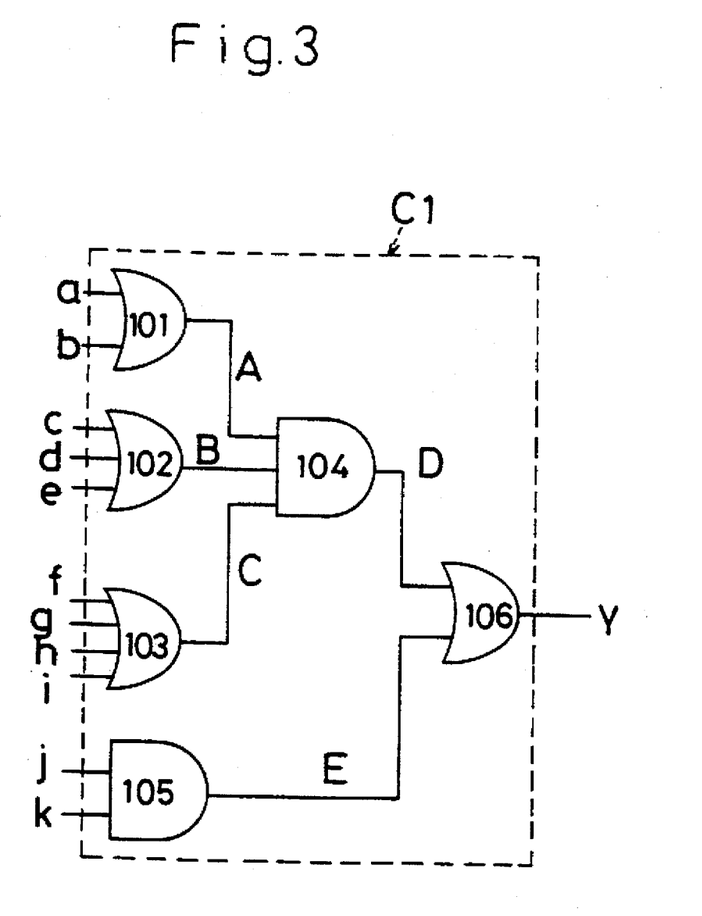
FIG. 3 is a circuit diagram showing a logic circuit created through the logic synthesis processing.

The content of the logic circuit C1 is shown in the following equation and FIG. 3.

FUNC:C1;

IN:a, b, c, d, e, f, g, h, i, j, k;

OUT:Y;

I01 (A)=OR2 (a, b)

I02 (B)=OR3 (c, d, e)

I03 (C)=OR4 (f, g, h, i)

I04 (D)=AND3 (A, B, C)

I05 (E)=AND2 (j, k)

I06 (Y)=OR2 (D, E)     [Equation 2]

In the above expression, FUNC is a proper name representing the logic circuit C1. IN represents input signals entered into the logic circuit C1, while OUT represents an output signal. OR and AND are physical logic elements corresponding to TTL realizing logical sum and logical AND of a printed circuit board of each LSI or standard cells or transistors of LSI. I01–I06 represent allocation names of physical logic elements used in the logic circuit C1. Input signal names of the logic elements are written on the right side of the equation, while the output signal name is written on the left side of the equation. Signals A, B, C, D and E represent internal wiring signals of the logic circuit C1, the total number of which varies depending upon the logic construction.

Next, a circuit analysis processing 3 is executed by the central processing unit 11, the memory unit 18 and the circuit analysis unit 13 in the following manner. As shown in FIG. 1B, a first processing 31 executes a logic simulation on the basis of the logic circuit C1 and circuit operation verificational information of table 1. In this logic simulation (i.e. first processing) 31, the total number of changes of output signal in each element—i.e. operation numbers of respective output signals a to Y—are calculated as shown in table 2. Then, in a second processing 32, the total number of changes of output signal is memorized as toggle number of each element. Namely, this embodiment refers to the number of operations from 0 to 1 or 1 to 0 as toggle number with respect to each of the input signals a–h, wiring signals A–E in the circuit, and output signal Y. The operation number of the output signal in each element is represented by M (i).

TABLE 2

| SIGNAL | TOGGLE NUMBER | SIGNAL | TOGGLE NUMBER |
|---|---|---|---|
| a | 10 | A | 10 |
| b | 0 | B | 0 |
| c | 2 | C | 0 |
| d | 4 | D | 10 |
| e | 0 | E | 2 |
| f | 2 | Y | 8 |
| g | 2 | | |
| h | 2 | | |
| i | 2 | | |
| j | 1 | | |
| k | 1 | | |

The table 2 obtains the toggle numbers with respect to each of the input signals g–k, however these toggle numbers are not used for calculating power consumption of the logic circuit since these input signals are entered into the logic circuit from external.

Thereafter, a third processing 33 is executed to obtain a power consumption W(i) of an arbitrary i-th element based on a product of power consumption and output signal in each element. More specifically, the power consumption $W(i)$ of the arbitrary i-th element is obtained as a product of the power consumption data $w(i)$ and the toggle number $M(i)$ of the element i as shown in the following equation. Table 3 shows numerical values representing power consumption of each element. The power consumption data $w(i)$ is an average of power consumption between the output signal change from 0 to 1 and the opposite signal change from 1 to 0.

$$W(i) = M(i) \cdot w(i) \quad \text{[Equation 3]}$$

TABLE 3

| ELEMENT | POWER CONSUMPTION |
|---------|-------------------|
| I01 | 10 mW |
| I02 | 0 mW |
| I03 | 0 mW |
| I04 | 10 mW |
| I05 | 2 mW |
| I06 | 8 mW |

Finally, a fourth processing 34 obtains a total power consumption D1 of all the elements 1-N based on the power consumption $W(i)$ of each element using the following equation.

$$D = \sum_{i=1}^{i=N} W(i) = 30 \text{ mW} \quad \text{[Equation 4]}$$

The circuit analysis processing 3 above-described is executed by the central processing unit 11, the memory unit 18 and the circuit analysis unit 13.

Returning to FIG. 1A, executed next is a high power consumption path retrieval processing 4, details of which is shown in FIG. 1C. Namely, the high power consumption path retrieval 4 comprises a fifth processing 41 for creating a directed graph G of the logic circuit C1 including nodes representing each logic element and input/output terminals and branches representing wiring. Then, a sixth processing 42 allocates the toggle number of each wiring in the logic circuit C1 as a cost of each branch in the directed graph G, thereby obtaining a cost-given directed graph G shown in FIG. 4A. Thereafter, a seventh processing 43 finds out a maximum cost propagation path from the cost-given directed graph G using graph theory such as solution of Lee algorithm or the like. Graph theory is disclosed, for example, in Aho, A. V., Hopcroft, J. E. and Ullman, J. D. "The Design and analysis of computer algorithms," Addison-Wesley, Reading, Mass. (1974). Lee algorithm is disclosed, for example, in Lee, C. Y. "An algorithm for path connections and its applications," IRE Trans. Electronic Comp., EC-10, pp.346–365.

The procedure for finding out the maximum cost propagation path using the Lee algorithm is as follows.

Figure 5A:
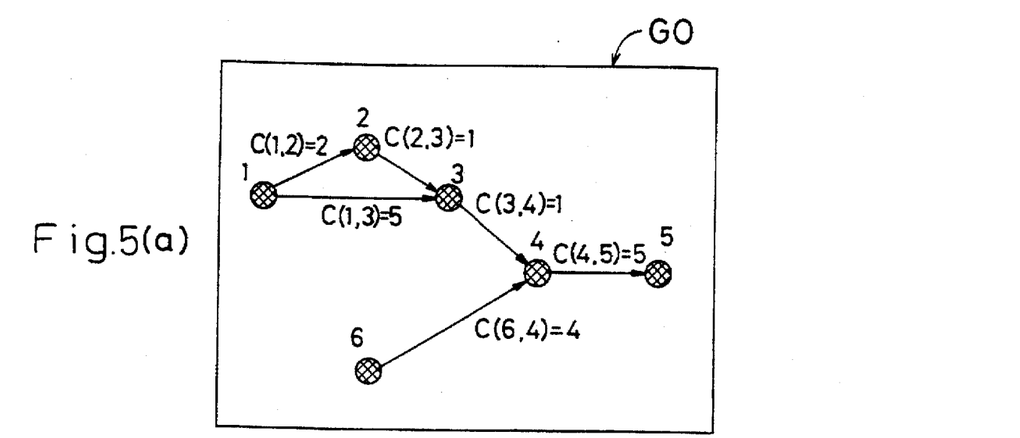
FIG. 5A is a view illustrating a directed graph wherein branches are given a cost.

FIG. 5A shows a graph 60 having cost-given branches, from which the maximum cost propagation path is retrieved. For the purpose of simplifying the explanation, it is assumed that there is no loop returning to the same node in the connecting relationship of the directed branches in the graph. Furthermore, it is assumed that $C(i, j)$ represents a cost of a directed branch having a start point on the i-th node and an end point on the j-th node. $NC(j)$ represents a total cost of a propagation path from the first node to the J-th node. When the total cost $NC(j)$ includes the directed branch cost $C(i,j)$, the start point i of the branch is held as $Nt(j)=i$.

Figure 5B:
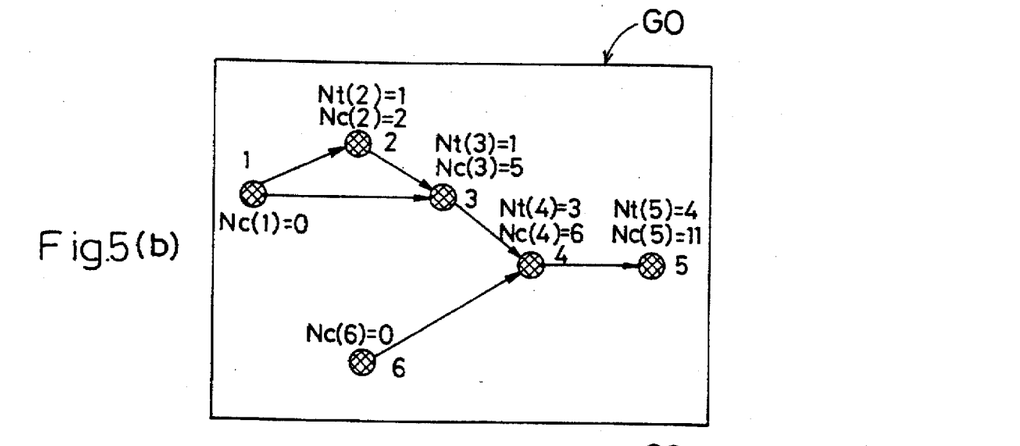
FIG. 5B is a view illustrating a procedure for obtaining a maximum cost propagation path.

First of all, data $NC(i)$ and $Nt(i)$, where $i=1,2 \ldots 6$, are created. In this creation, a first step is carried out to retrieve a specific directed branch having a maximum value in the value $COST=NC(k)+C(k,i)$ among all the directed branches entering into the node i, and to judge its start point k0. Next, a second step defines $Nt(i)=k0$ and $NC(i)=NC(k0)+C(k0,i)$. Thereafter, a third step repeats the above-described first and second steps with respect to all the nodes until the start point Nt and total cost NC of each node are fixed to constant values. Through the above processing, a map shown in FIG. 5B is obtained.

Figure 4:
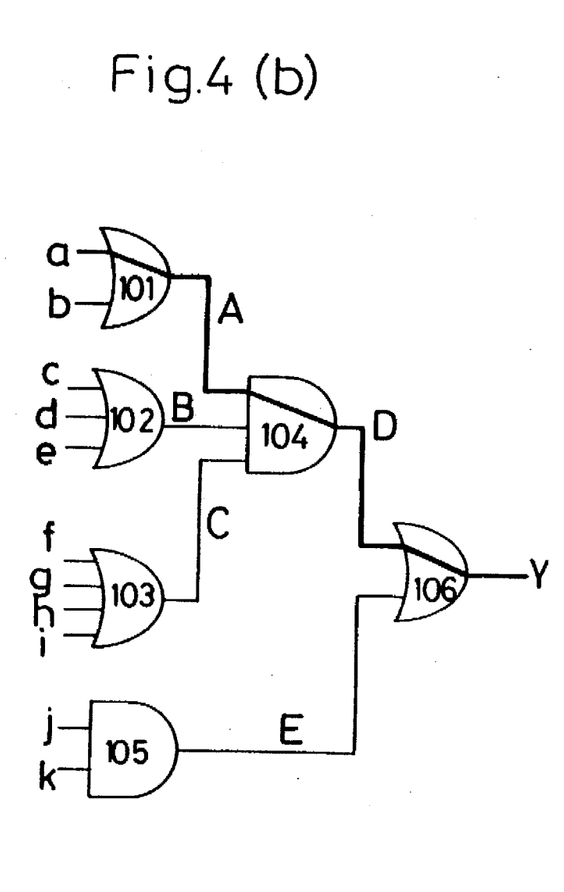
FIG. 4A is a view illustrating a directed graph wherein branches are given a cost.
FIG. 4B is a view showing a maximum power consumption path in the logic circuit.
Figure 5C:
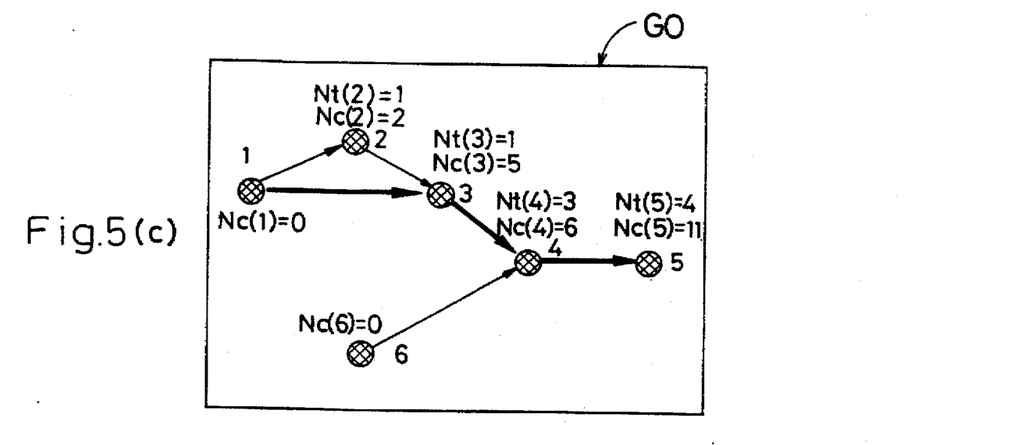
FIG. 5C is a view showing a resultant maximum cost propagation path.

Next, to find out the maximum cost propagation path, a fourth step retrieves the node m having the maximum cost and resisters the obtained node m into a list L. Subsequently, a fifth step defines $n=Nt(m)$ and resisters n into the list L (refer to FIG. 4A). In a sixth step, the procedure is directed to proceed to a seventh step when the data $Nt(n)$ is not defined, or directed to return to the fifth step with a definition $n=Nt(n)$ when the node number data exists. In the seventh step, the nodes stored in the list L are rearranged in the order opposite to their resister order. The maximum cost propagation path is obtained from the nodes thus rearranged and associated branches.

Efficiency of creating the data $NC(i)$, $Nt(i)$, where $n=1,2 \ldots 6$, will be improved by using the method of processing nodes corresponding to the input terminals first then successively processing adjacent nodes. (Lee algorithm) If there is a loop in the graph, it will be useful to additionally adopt a method of cutting a branch at an appropriate portion to approximately obtain the maximum cost propagation path. FIG. 4B shows the maximum cost propagation path obtained from the directed graph, overlapped on the logic circuit C1.

With the above processing, the maximum power consumption path a-A-D-Y is obtained. In the case where a group of a designated number of maximum power consumption paths is obtained, previously described maximum propagation path solution method will be utilized to obtain the maximum power consumption path connecting a node out of the longest propagation path to a node on the longest propagation path and then transferring to the longest propagation path from that node.

The high power consumption path retrieval processing 4 is carried out by a high power consumption path retrieval means consisting of the central processing unit 11, the memory unit 18 and propagation path retrieval unit 14.

Hereinafter, for the purpose of simplifying the explanation, it is assumed that the propagation path a-A-D-Y is the only one power consumption path group.

Meaning of obtaining the maximum power consumption path group is derived from the consideration based on the fact that changes of signal values are successively propagated along the signal propagation path as cause of power consumption. More specifically, if the power consumption amount is reduced in this maximum power consumption propagation path, it will be very effective to reduce the overall power consumption of all the signal propagation paths in the logic circuit.

Figure 6A:
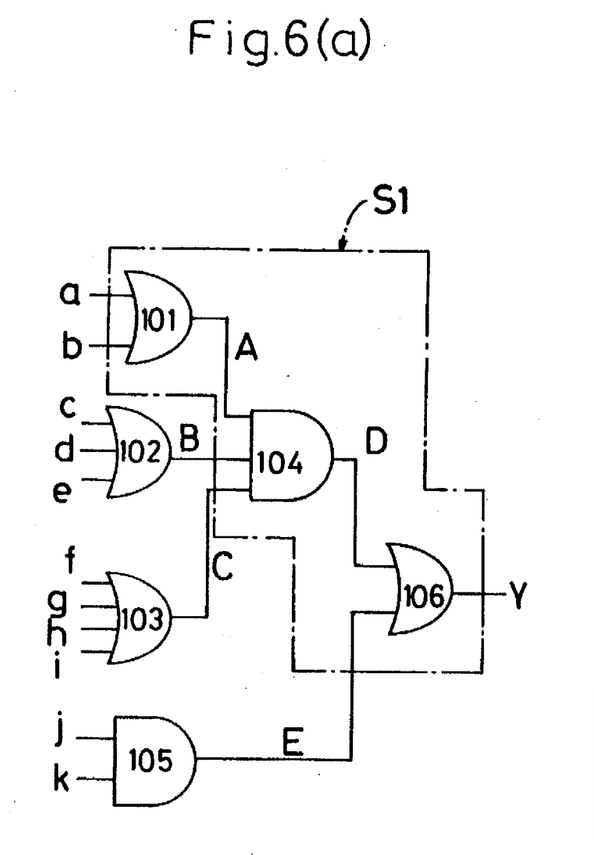
FIG. 6A is a view illustrating division of circuit in a plan view manner.
Figure 6B:
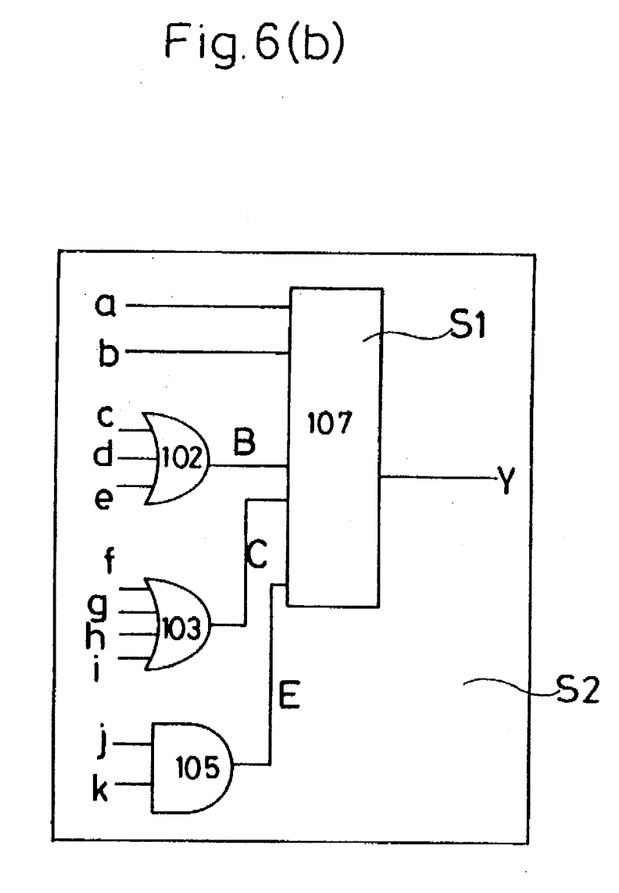
FIG. 6B is a view illustrating the division of circuit in the level of logic.

Next, in FIG. 1A, a circuit partition processing 5 is executed so as to optimize power consumption in the maximum power consumption path group. More specifically, elements I01, I04 and I06 existing on the maximum power consumption path a-A-D-Y is grouped into a partial circuit S1 to be regarded as one element. Thus, the logic circuit is replaced by a logic circuit S2 which comprises the partial circuit S1 and the remaining elements other than the partial circuit S1. This circuit partition is easily realized by separating elements as shown in FIGS. 6A and 6B. The partial circuit S1 has external terminals a, b, B, C, E and Y and internal terminals A and D. The following equation, representing the logic circuit S2 in the form of hierarchical expression, includes the partial circuit S1.

FUNC:S2;

IN:a, b, c, d, e, f, g, h, i, J, k;

I02 (B)=OR3 (c, d, e)

I03 (C)=OR4 (f, g, h, i)

I05 (E)=AND2 (j, k)

I07 (Y)=S1 (a, b, B, C, E)

FUNC:S1;

IN:i1, i2, i3, i4, i5;

OUT:yy;

I01 (A)=OR2 (i1, i2)

I04 (D)=AND3 (A, i3, i4)

I16 (yy)=OR2 (D, i5)  [Equation 5]

Above processing is carried out by the central processing unit 11, the memory unit 18 and the circuit partition unit 15.

Next, a level number reduction processing 6 is applied to the partial circuit S1, thereby synthesizing a logic circuit C2 having a lower power consumption. More specifically, a conventional method of minimizing the number of level in the logic circuit synthesis is utilized. Through this processing, a partial circuit S3 having the number of level smaller than that of the logic circuit S1 will be obtained as shown in the following equation and FIG. 7B.

Figure 7A:
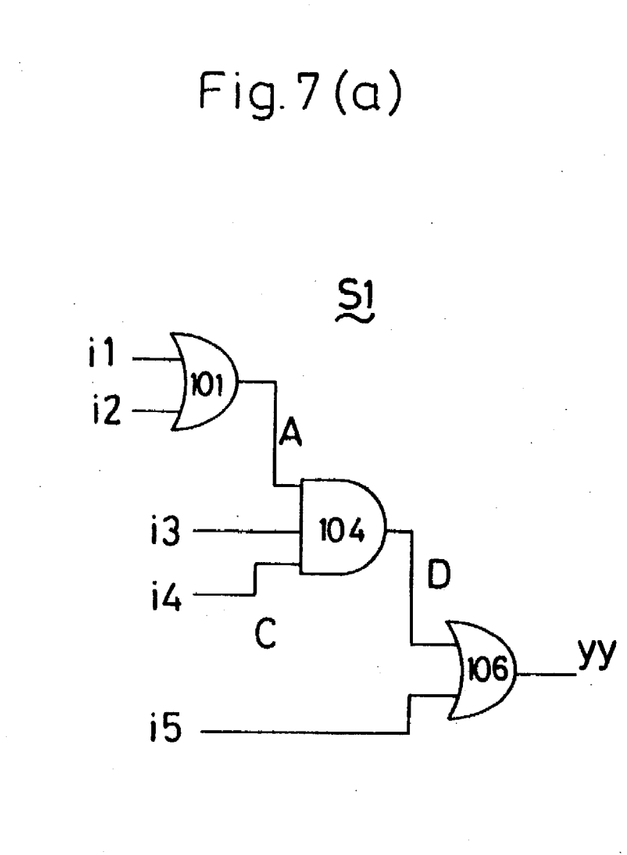
FIG. 7A is a view showing a partial circuit whose number of level is larger than others.
Figure 7B:
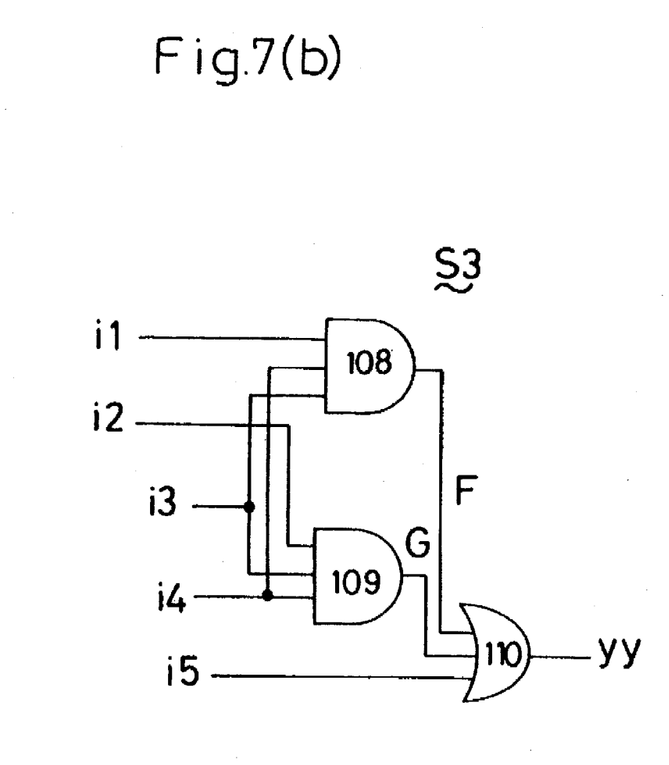
FIG. 7B is a view showing the partial circuit as a result of reduction of the number of level.

FUNC:S3;

IN:i1, i2, i3, i4, i5;

OUT:yy;

I09 (F)=AND3 (i1, i3, i4)

I09 (G)=AND3 (i2, i3, i4)

I10 (yy)=OR3 (F, G, E)  [Equation 6]

Meaning of optimizing the number of level will be understood from the effect that the number of logic elements receiving affection of operation is reduced by reducing the number of level in the signal propagation path whose operation is so frequent that a large electric power is consumed. Thus, the logic circuit C2 including the partial circuit S3, the number of level of which is optimized, is obtained as shown in the following equation and FIG. 8.

Figure 8:
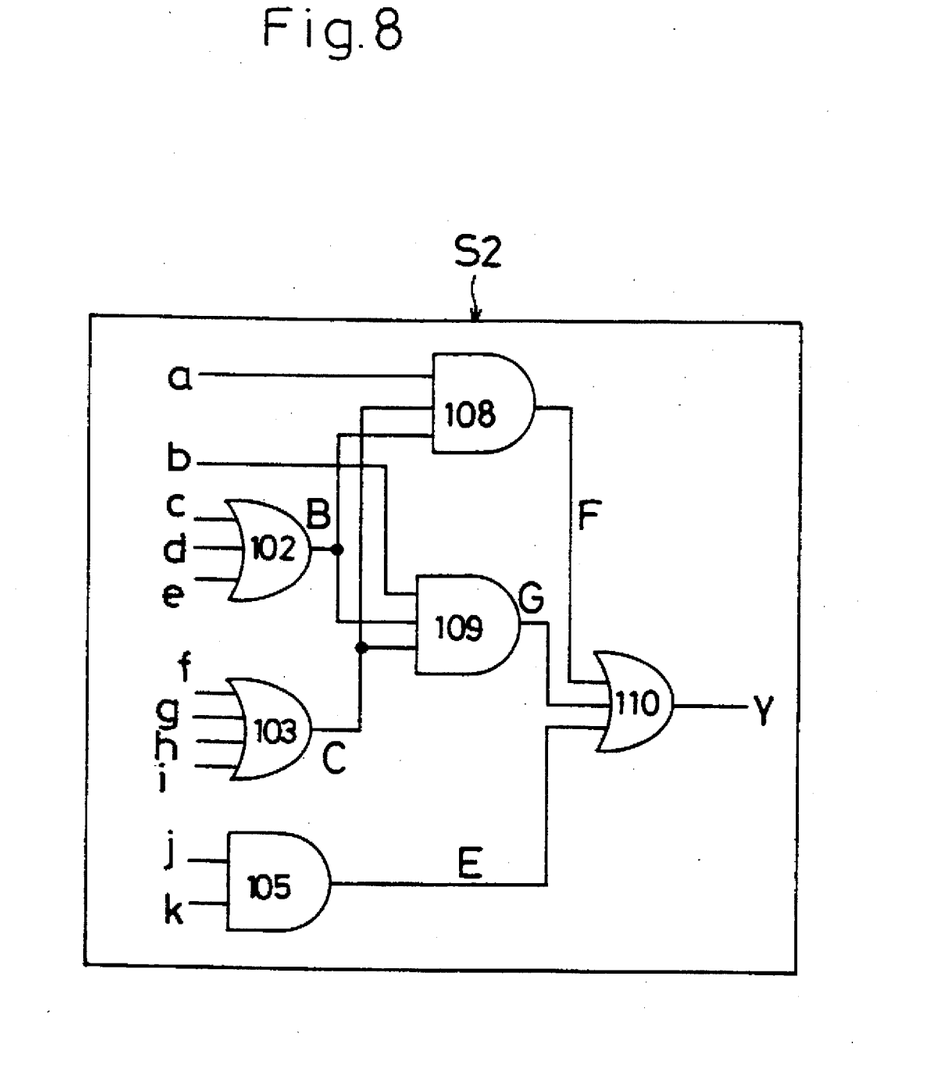
FIG. 8 is a view showing a finalized logic circuit to be output.

FUNC:C2;

IN: a, b, c, d, e, f, g, h, i, j, k;

I02 (B)=OR3 (c, d, e)

I03 (C)=OR4 (f, g, h, i)

I05 (E)=AND2 (j, k)

I08 (F)=AND3 (b, B, C)

I10 (Y)=OR3 (F, G, E)  [Equation 7]

The level number reduction processing 6 is carried out by a level number reduction means consisting of the central processing unit 11, the logic synthesis unit 12 and the memory unit 18.

Next, in FIG. 1A, a circuit analysis processing 7 calculates a power consumption W2 of each element and a total power consumption D2 on the basis of the created logic circuit D2, thereby obtaining table 4 and the following equation in the same manner as the previous circuit analysis processing 3.

The circuit analysis processing 7 is carried out by the central processing unit 11, the circuit analysis unit 13 and the memory unit 18.

TABLE 4

| SIGNAL | TOGGLE VALUE | SIGNAL | TOGGLE VALUE |
|--------|--------------|--------|--------------|
| a | 10 | B | 0 |
| b | 0 | C | 0 |
| c | 2 | E | 2 |
| d | 4 | F | 10 |
| e | 0 | G | 0 |
| f | 2 | Y | 8 |
| g | 2 | | |
| h | 2 | | |
| i | 2 | | |
| j | 1 | | |
| k | 1 | | |

D2=20 mW  [Equation 8]

Then, an improvement judgement processing 8 makes a judgement as to whether the power consumption is improved or not by comparing the total power consumption between the original logic circuit C1 and the logic circuit C2 the number of level of which is optimized. In this embodiment, whereas the total power consumption D1 of the logic circuit C1 is 30 mW, the total power consumption D2 of the logic circuit C2 is reduced to 20 mW. It is thus found that an improvement obtained is 10 mW.

Thereafter, in a partial circuit replacement processing 9, if the improvement is recognized, the partial logic circuit S1 is replaced by the partial circuit S3 the number of level of which is optimized, so that the logic circuit C1 is replaced by the logic circuit C2 the number of level of which is optimized. Then, the procedure returns to the power consumption path retrieval processing 4. The partial circuit replacement processing 9 is carried out by a partial circuit replacing means comprising the central processing unit 11.

According to this embodiment, a finalized circuit output processing 10 produces the logic circuit C2 shown in FIG. 8 as a final result when the same logic circuit C2 is repeatedly obtained as optimum circuit.

With improvement brought by the present invention, it is found that the logic circuit C1 having an element area 600 $\mu m^2$, a delay time 3 ps and a power consumption 80 mW, created by the conventional logic synthesis, is replaced by the logic circuit C2 having an element area 600 $\mu m^2$, a delay time 3 ps and a power consumption 20 mW.

Furthermore, finding out the partial circuit S1 having high power consumption is effective to narrow the range of optimization of the number of level within a limited smaller region. Such an optimization is advantageous in reducing the processing time, when it is compared with a method of optimizing power consumption with respect to all the paths in the logic circuit. Moreover, as the improvement of power consumption is focused only on the partial circuit having a large power consumption, expected effect of improvement will be fairly large.

Although the above-described embodiment assumes that there is only one maximum power consumption path group, it is needless to say that the present invention is similarly applied to the embodiment including a plurality of high power consumption path groups. Although the above-described embodiment assumes that the power consumption of each element is 1 mW, the element area is 100 µm² and the delay time is 1 ps it is needless to say that these values are varied depending upon each element. Furthermore, even in the case where the toggle number is dealt with independently in response to each change of 0 to 1 or 1 to 0, calculations will be similarly executed and therefore the present invention can be applicable to such a case.

As this invention may be embodied in several forms without departing from the spirit of essential characteristics thereof, the present embodiment as described is therefore intended to be only illustrative and not restrictive, since the scope of the invention is defined by the appended claims rather than by the description preceding them, and all changes that fall within the metes and bounds of the claims, or equivalents of such metes and bounds, are therefore intended to be embraced by the claims.

What is claimed is:

1. A logic synthesis method for synthesizing a gate level logic circuit using a computer based on behavioral description of LSI, comprising steps of:

an input processing for inputting the behavioral description of said LSI and element information including at least an element area, a delay time of signal propagation and a power consumption;

a logic synthesis processing for synthesizing a logic circuit taking area specification and speed specification into consideration based on said behavioral description and element information entered in said input processing;

a high power consumption path retrieval processing, in a plurality of signal propagation paths in the logic circuit synthesized by said logic synthesis processing, obtaining respective power consumptions of logic elements existing on each of the signal propagation paths, which are respectively calculated based on counting the number of times of change in output of the logic elements, to obtain respective sums of the power consumptions of all the logic elements existing on the respective signal propagation paths and finding out a specific signal propagation path having a larger power consumption than another of said signal propagation paths;

a level number reduction processing for reducing a number of level of a partial logic circuit constituting a part of said specific signal propagation path having a large power consumption which is found out by said high power consumption path retrieval processing, and producing another partial logic circuit a number of level of which is smaller than that of said partial logic circuit; and a circuit replacement processing for replacing said partial logic circuit constituting a part of said specific signal propagation path having a large power consumption by said another partial logic circuit created by said level number reduction processing.

2. A logic synthesis apparatus for synthesizing a gate level logic circuit using a computer based on behavioral description of LSI, comprising:

input means for inputting the behavioral description of said LSI and element information including at least an element area, a delay time of signal propagation and a power consumption;

logic synthesis means for synthesizing a logic circuit taking area specification and speed specification into consideration based on said behavioral description and element information entered from said input means;

high power consumption path retrieval means, in a plurality of signal propagation paths in the logic circuit synthesized by said logic synthesis means, obtaining respective power consumptions of logic elements existing on each of the signal propagation paths, which are respectively calculated based on counting the number of times of change in output of the logic elements, to obtain respective sums of the power consumptions of all the logic elements existing on the respective signal propagation paths, and finding out a specific signal propagation path having a larger power consumption than another of said signal propagation paths;

level number reduction means for reducing a number of level of a partial logic circuit constituting a part of said specific signal propagation path having a large power consumption which is found out by said high power consumption path retrieval means, and producing another partial logic circuit a number of level of which is smaller than that of said partial logic circuit; and circuit replacement means for replacing said partial logic circuit constituting a part of said specific signal propagation path having a large power consumption by said another partial logic circuit created by said level number reduction means.

3. The logic synthesis method in accordance with claim 1, further comprises a circuit analysis processing for obtaining a power consumption of each element constituting said logic circuit synthesized by said logic synthesis processing and a total power consumption of said logic circuit prior to said high power consumption path retrieval processing.

4. The logic synthesis method in accordance with claim 3, wherein said input processing inputs circuit operation verificational information indicating expectation to test vectors for the logic circuit; and said circuit analysis processing comprises:

a first processing for executing logic simulation based on the logic circuit and said circuit operation verificational information;

a second processing for memorizing an output operation number M(i) of an arbitrary i-th (i=1-N) element obtained from the logic simulation in said first processing;

a third processing for obtaining a power consumption W(i) of the arbitrary i-th element based on an equation W(i)=M(i)·w(i), where M(i) represents the output operation number of the arbitrary i-th element obtained in said second processing while w(i) represents a power consumption per operation calculated from said element information; and a fourth processing for obtaining a total power consumption D based on an equation $$D = \sum_{i=1}^{i=N} W(i),$$

which is a sum of power consumption obtained in said third processing with respect to all the elements N in the logic circuit.

5. The logic synthesis method in accordance with claim 4, wherein said high power consumption path retrieval processing comprises:

a fifth processing for creating a directed graph G(i) representing input and output terminals of an arbitrary i-th (i=1-N) signal propagation path in the logic circuit;

a sixth processing for allocating a cost to an output branch of each node of said directed graph G(i) obtained in said fifth processing, said cost being the power consumption W(i) of a logic element acting as said each node, which is obtained in said third processing of the circuit analysis processing; and a seventh processing for finding out a propagation path having a high power consumption from said directed graph G(i) which is cost given in said sixth processing.

6. The logic synthesis method in accordance with claim 5, wherein said seventh processing of the high power consumption path retrieval processing uses Lee algorithm of graph theory to find out the propagation path having a high power consumption.

7. The logic synthesis method in accordance with claim 1 or 5, wherein the specific signal propagation path having a larger power consumption to be retrieved in said high power consumption path retrieval processing is a signal propagation path having a maximum value in the sum of power consumption.

8. The logic synthesis method in accordance with claim 1 or 5, wherein said high power consumption path retrieval processing retrieves a signal propagation path group collecting a plurality of signal propagation paths having a large value in the sum of power consumption in the logic element.

9. The logic synthesis method in accordance with claim 1, wherein, prior to replacement of partial logic circuit, said circuit replacement processing checks whether a total power consumption of the logic circuit is reduced or not when said partial logic circuit constituting a part of said specific signal propagation path is replaced by said another partial logic circuit created by said level number reduction processing.

10. The logic synthesis method in accordance with claim 1, wherein said high power consumption path retrieval processing, said level number reduction processing and said circuit replacement processing are successively executed again after said circuit replacement processing has completed replacement of partial logic circuit.

* * * * *